United States Patent
Lewelling et al.

(10) Patent No.: US 6,420,943 B1
(45) Date of Patent: Jul. 16, 2002

(54) CONDUCTING PATH WITH TWO DIFFERENT END CHARACTERISTIC IMPEDANCES DETERMINED BY DOPING

(75) Inventors: Ricky S. Lewelling, Buda; Richard W. Schuckle, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/478,054

(22) Filed: Jan. 5, 2000

(51) Int. Cl.[7] ............................. H01P 5/08; H03H 7/38
(52) U.S. Cl. ............................. 333/33; 333/34; 257/611
(58) Field of Search ...................... 333/33, 34; 257/536, 257/607, 611

(56) References Cited

U.S. PATENT DOCUMENTS 3,419,813 A * 12/1968 Kamnitsis .................. 333/34 X
5,111,157 A * 5/1992 Komiak ...................... 330/286
5,774,093 A * 6/1998 Schiltmans ................ 333/33 X
6,107,119 A * 8/2000 Farnworth et al. .......... 438/106

* cited by examiner

*Primary Examiner*—Justin P. Bettendorf
(74) *Attorney, Agent, or Firm*—Conley, Rose & Taylon, PC; B Noël Kivlin

(57) ABSTRACT

A better impedance match between a signal transmitting component and a signal transmitting component circuit in a semiconductor circuit is achieved by controlling the parameters of the conducting path coupling the signal transmitting and receiving components. The parameters are controlled such that the portion of the conducting path coupled to the transmitting component has a characteristic impedance generally matching the output impedance of the transmitting component and the portion of the conducting path coupled to the signal receiving component has a characteristic impedance generally matching the input impedance of the signal receiving component. The impedance in portions of the conducting path can controlled by varying the geometric cross-section of the conducting path, the composition of the portion of the conducting path, and/or the amount or nature of the doping of the portion of the conducting path.

2 Claims, 2 Drawing Sheets

CONDUCTING PATH WITH TWO DIFFERENT END CHARACTERISTIC IMPEDANCES DETERMINED BY DOPING

BACKGROUND OF THE INVENTION

1. Field of the Invention

This invention relates generally to semiconductor circuits and, more particularly, to the conducting paths and conducting traces that transmit signals between semiconductor components and/or groups of semiconductor components.

2. Description of the Related Art

As data processing systems and components have been designed for ever increasing power, one of the parameters used to effectuate the more powerful systems and the components implementing the systems is the frequency of the system clock. As the frequency of the system clock has been increased, some frequency-dependent parameters, having a deleterious effect on the performance of the data processing system, have become important.

Referring to FIG. 1, a signal transmitter/receiver configuration, typically found in an semiconductor circuit, is illustrated. P-type metal-oxide semiconductor, field-effect transistor (MOSFET) 12 and n-type MOSFET 14 are coupled in series and have input signals applied to the gate terminals thereof. Transistors 12 and 14 apply signals, determined by the input signals to transistor 12 and transistor 14, to conducting path 11, conducting path 11 being coupled to the junction of the source/drain terminals. Conducting path 11 conducts the signal to the gate electrodes of p-type MOSFET 16 and n-type MOSFET 18, the transistors 16 and 18 being coupled in series. The output signal is applied to the source/drain junction of transistors 16 and 18. As the frequency of the processing system clock is increased, any mismatch of the output impedance of the transmitting transistor pair 12, 14 and the input impedance of the receiving transistor pair 16, 18 becomes increasingly important. The mismatch in impedance would be reflected in an increased noise in the transmitted signal, the increased noise arising, at least in part, from signal reflections resulting from the mismatched impedances.

In order to reduce the effect of a mismatch in impedance between the transmitting transistor pair 12, 14 and the receiving transistor pair 16, 18, one prior art technique involves the reduction of the mismatch by the adjustment of the parameters of the transistors themselves. In this technique, the transistor variables, such as geometrical dimensions, doping levels, doping dimensions, etc. are adjusted during the semiconductor fabrication process to provide impedances in the transmitting circuit and in the receiving circuit. Because the transistor parameters are not independent, this technique has limited flexibility. In addition, transistor parameters are typically optimized for performance, and departures from the optimized parameters may result in an unacceptable penalty in performance.

Another technique to reduce the transmitting unit/receiving unit impedance mismatch is to add a physical component, for example as shown in FIG. 2. In this Figure, the circuit shown in FIG. 1 is repeated. In addition, impedance 21 has been added to the input circuit of the receiving transistor pair 16, 18. While this additional circuit element can improve the impedance mismatch, the impedance 21 can result in lower response time, i.e., can result in a performance penalty.

As the frequency is increased, a further complication arises. When the transmitting unit and the receiving unit are coupled by a conducting path longer than a wavelength apart, the impedance seen be either component is the intrinsic impedance of the conducting path itself. This intrinsic impedance is typically referred to as the characteristic impedance and is denoted by "Z". Thus, for high frequencies, a potential impedance mismatch can occur not just between a transmitting unit and a receiving unit, but between the transmitting unit and the conducting path and between the conducting path and the receiving unit.

A need has therefore been felt for a technique for improving the impedance match between the impedance of a signal transmitting circuit and the impedance of the corresponding signal receiving circuit. One feature of this technique would be that the parameters of the semiconductor components would not be altered. Another feature of the present invention would be that the performance of the transmitting/receiving circuit would not be compromised. A further feature would be that the improvement in the impedance mismatch would involve the conducting path coupling the transmitting unit and the receiving unit.

SUMMARY OF THE INVENTION

The aforementioned and other features are accomplished, according to the present invention, by adjusting the parameters of a conducting path so that the characteristic impedance of a first portion of the conducting path coupled to a transmitting circuit matches an output impedance of the transmitting circuit and the characteristic impedance of a second portion of the conducting path coupled to a receiving circuit matches the input impedance of the receiving circuit. A middle portion of the conducting path provides a relatively smooth transition from the parameters of the first portion of the conducting path to the parameters of the second portion of the conducting path. In the preferred embodiment, the geometry of the conducting path is selected such that the characteristic impedances of the first and second portions of the conducting path have appropriate characteristic impedances at the operating clock frequency. In particular, the width of the conducting path is selected for adjustment, this parameter being particularly convenient to control in the fabrication of circuit boards. Other parameters of the conducting path such as composition or doping levels can also be controlled. These parameters can be used to reduce the mismatch of impedances when an actual impedance match is not possible.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
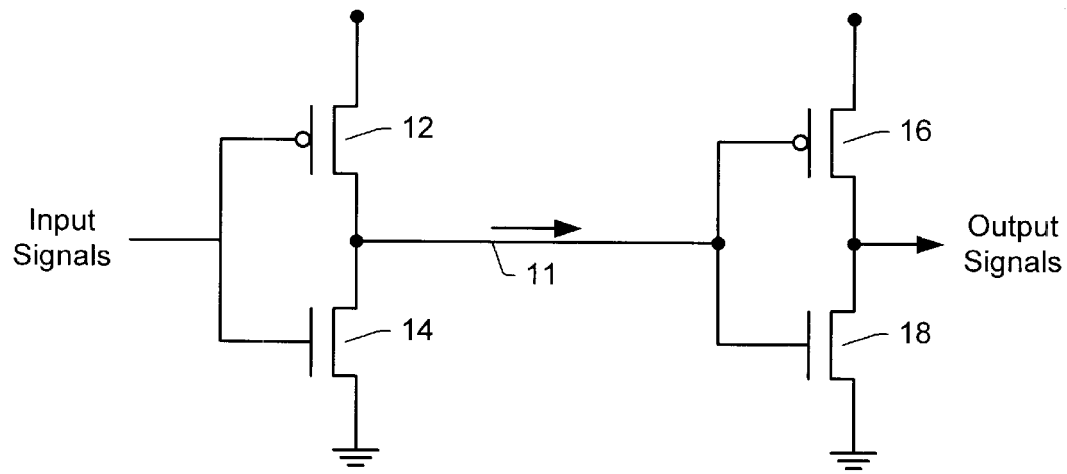
FIG. 1 is a circuit diagram of a illustrating the problem addressed by the present invention.
Figure 2:
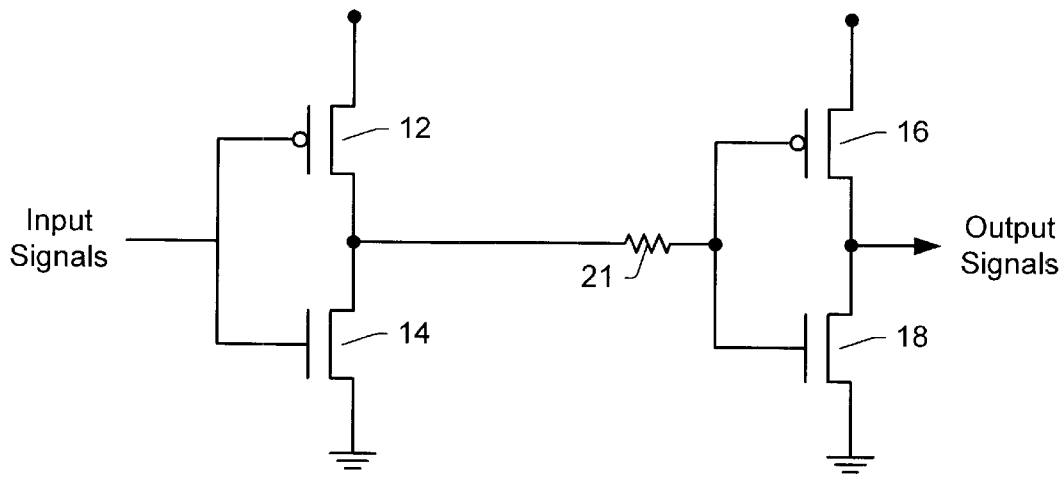
FIG. 2 is the circuit diagram of FIG. 1 illustrating a technique for addressing the impedance mismatch problem according to the prior art.

FIG. 1 and FIG. 2 have been discussed with respect to the related art.

Figure 3:
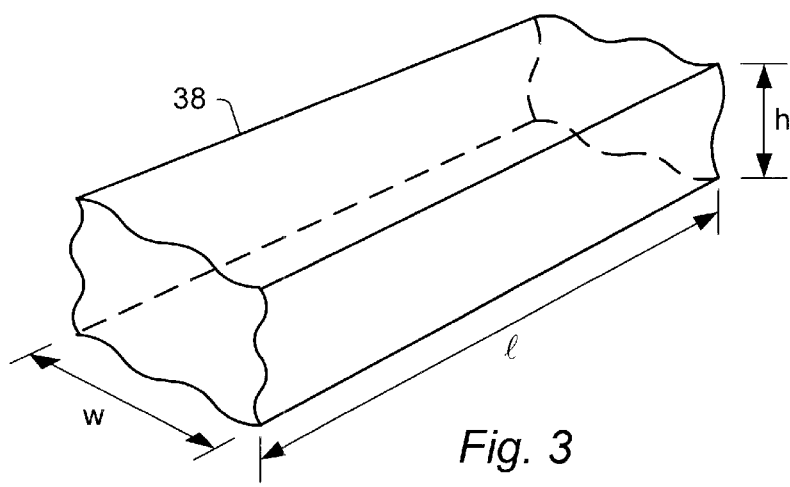
FIG. 3 is a perspective view of a portion of a conducting path illustrating the parameters that determine the conducting path resistance.

Referring to FIG. 3, a unit length of a conducting path 30 is shown. The width of the conducting path 30 is W, the thickness or height of the conducting path 30 is H, the unit length is dL, and the resistivity of the conducting path is given by $\rho$. Therefore, the resistivity is given by $$dR/dL = \rho/WH \qquad 1.)$$

As will be clear to those skilled in the art, equation 1 is true for steady state or nearly steady state. As the frequency becomes higher, i.e. in the frequency operating range of the modern data processing system, the frequency dependent parameters, such as the per unit inductance l and the per unit capacitance c, can no longer be neglected. At even higher frequencies, the resistance of the conducting path can be neglected when the conducting path is fabricated from a high conductivity material such as copper.

Figure 4:
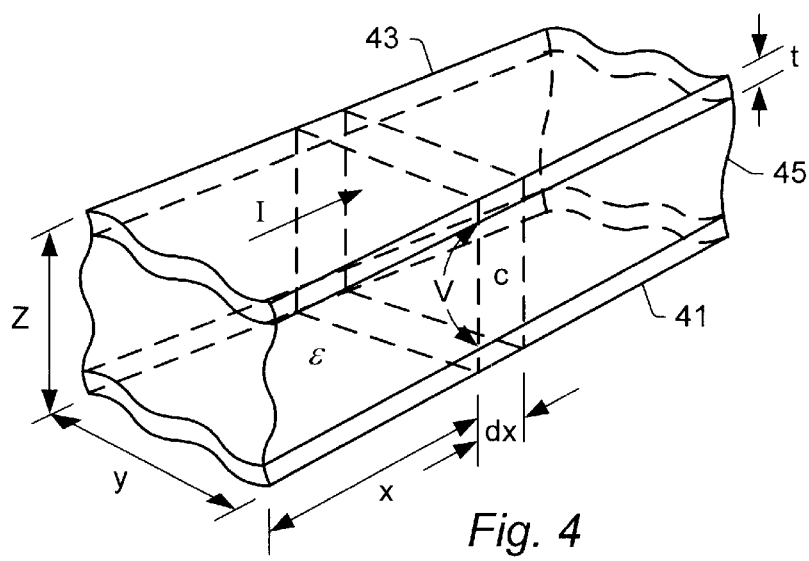
FIG. 4 is a perspective view of a portion of a conducting path illustrating the parameters that determine the characteristic impedance of the conducting path.

The parameters that determine the propagation of electrical wave along a conducting path can be understood with reference to FIG. 4. (For the present example, distributed resistance is neglected.) In FIG. 4, a substrate 41 and a conducting path 43 are separated by an insulating layer 45 are illustrated. The conducting path 43 has a width of y, a thickness of t, and is separated from the substrate by a distance of z. In addition, in an incremental length dx, a capacitance per unit length c is encountered. In addition, as is well known from the solution of the (lossless) wave equation, the velocity v of the propagating wave is given by $$v = 1/(l \cdot c)^{1/2} \qquad 1.)$$

where l is the inductance per unit length and c is the capacitance per unit length. When a propagating wave reaches position x on the conducting path 43, the current I flowing into the incremental distance dx for an incremental time dt is given by $$I = Q \cdot dx/dt = V \cdot c dx/dt = V \cdot c \cdot v \qquad 2.)$$

where V is the voltage between the conducting path 43 and the substrate 41 at the distance x along the conducting path. Combining equations 1.) and 2.), $$I = V(c/l)^{1/2} \qquad 3.)$$

The characteristic impedance $Z_0$ is therefore given by $$Z_0 = V/I = (l/c)^{1/2} \qquad 4.)$$

The characteristic impedance $Z_0$ is a function of the geometry of the conducting path and, in the past has generally been considered to be a constant. However, for purposes of the present invention, the fact that the geometry of the path can be altered provides the possibility for improving the performance of integrated circuits. As indicated above, one of the noise contributions is the result of the reflection of propagating at the terminating element of a conducting path. The reflection of a wave for an incident wave is given by the reflection coefficient R $$R = V\text{reflec}/V\text{inc} = I\text{reflec}/I\text{inc} = (Z_R - Z_0)/(Z_R + Z_0) \qquad 5.)$$

where Vinc is the voltage of the incident wave, Vref is the voltage of the reflected wave, Iinc is the current of the incident wave, Iref is the current of the reflected wave $Z_R$ is the impedance of the receiving element, and $Z_0$ is the characteristic impedance of the conducting line. The last term of equation 5 explicitly indicates the well known impedance matching result, i.e., when $Z_R = Z_0$, then no reflections result. Therefore to minimize noise on the conducting path, the present invention ideally requires that, on the receiver end of conducting path, the impedance of the conducting path be $Z_R = Z_0$. However, not only should the characteristic impedance of the conducting path match the input impedance $Z_R$ of the receiver, but ideally, the characteristic impedance $Z_0$ should equal the output impedance $Z_T$ of the transmitting unit. The ideal configuration for a conducting path would be for a smoothly varying characteristic impedance, the characteristic impedance equal to the output impedance of the transmitter ($Z_T = Z_0$) at one end of the conducting path and the characteristic impedance equal to the input impedance ($Z_R = Z_R$) at the receiving unit. (The characteristic impedance is ideally changed either smoothly or in small increments to minimize reflections from discontinuities.)

Figure 5:
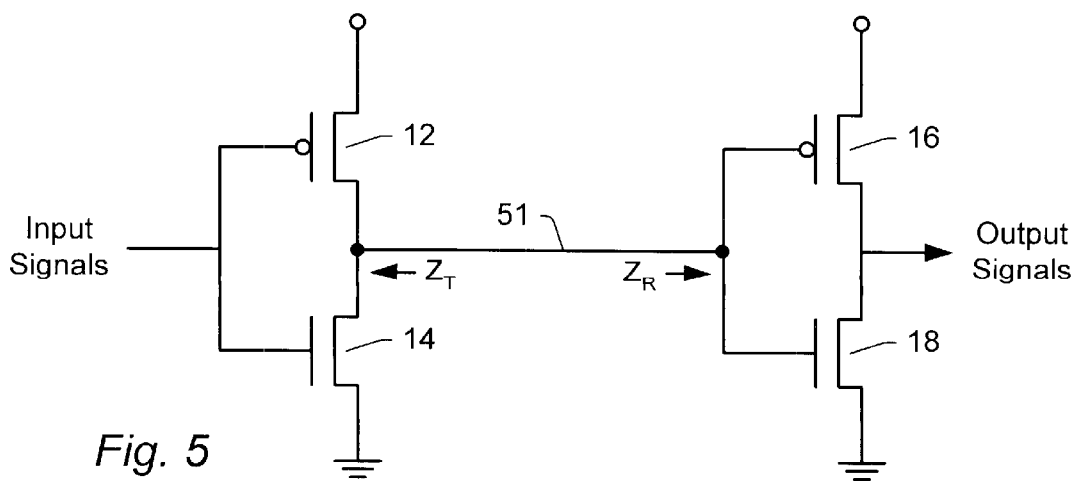
FIG. 5 is circuit diagram of FIG. 1 illustrating a technique for improving the impedance match of conducting path according to the present invention.

Referring to FIG. 5, the solution to improving the signal transmission characteristics of a conducting path according to the present invention is illustrated. The same circuit shown in FIG. 1 and FIG. 2 provide a the transmitting element(s) (12, 14) and the receiving element(s) (16, 18). The conducting path 51 couples the transmitting element(s) and the receiving element(s). The representation of the conducting path 51 is shown as having a variable geometry. This variable geometry illustrates that the conducting path 51 has a first characteristic impedance $Z_T$ with respect to the transmitting element(s) and a second characteristic impedance $Z_R$ with respect to the receiving element(s).

As will be clear, the actual matching of the impedance of the transmitting elements and matching the impedance of the receiving element has several complications. While the signal on the conducting path, typically an approximation to a square wave or to a rectangular wave, can have a defined center frequency, the signal profile will insure that the actual signal is rich in harmonics. Even an ideal signal matching will be effective only for the center frequency. Furthermore, the ability to change geometric parameters is limited by design considerations. Such design considerations include the need to provide a room between conducting paths to accommodate the uncertainties in the fabrication process. In addition, a minimum spacing between conducting paths can be required to minimize cross-talk, thereby limiting the flexibility for geometric adjustments to the conducting paths.

Several other properties, other than geometric properties, can be used to control the characteristic impedance of the conducting path. For example, the dielectric constant $\epsilon$ of the insulating region can be altered as a function of distance of along the conducting path. Such a dependence can, however, be difficult to implement with current fabrication techniques.

In addition, when the assumption that the resistivity of the conducting path can not ignored, this component of the impedance can also be used to control the characteristic impedance of the conducting path. For example, the resistivity $\rho$ is a function of the composition of the conducting path. The conducting path may be fabricated of two separate materials, each material having a different resistivity. Similarly, the conducting path can be comprised of an alloy in which the ratios of the constituent materials or even the constituent materials themselves can be varied.

As will be clear to those skilled in the art, the technique of varying the parameters of the conducting path to provide a better impedance match between a signal transmitting component and a signal receiving component be less effective as the wave length of the signal transmitted on the conducting path approaches the distance between the transmitting and receiving components.

According to an embodiment of the present invention, a first end portion of a conducting path according to the present invention has a smaller thickness than a thickness of a second end portion of the conducting path.

According to another embodiment of the present invention, a first end portion of a conducting path according to the present invention has a smaller cross-section than a cross-section of a second end portion of the conducting path.

According to another embodiment of the present invention, a first end portion of a conducting path according to the present invention has a larger dopant concentration than a dopant concentration of a second end portion of the conducting path.

According to another embodiment of the present invention, a first end portion of a conducting path according to the present invention is doped with a different element than a doping element of a second end portion of the conducting path.

According to another embodiment of the present invention, a conducting path according to the present invention is formed on a circuit board.

According to another embodiment of the present invention, a conducting path according to the present invention is part of an integrated circuit.

According to another embodiment of the present invention, adjusting the impedances of a first portion and a second portion of a conducting path according to the present invention includes adjusting conducting path parameters, wherein the conducting path parameters are selected from the group consisting of cross-section dimensions of the conducting path, composition of the conducting path and doping levels of the conducting path.

According to another embodiment of the present invention, a first and second characteristic impedances of a first and second portions of a conducting path according to the present invention, respectively, are selected by varying the parameters selected from the group of parameters consisting of a geometric cross-section dimensions, a composition, and doping levels.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A conducting path comprising:
   a first end portion having parameters providing a first characteristic impedance at a predetermined frequency;
   a second end portion having parameters providing a second characteristic impedance at the predetermined frequency; and
   a middle portion coupled to the first end portion and to the second end portion, the middle portion providing a transition region between the first characteristic impedance of the first end portion of the conducting path and the second characteristic impedance of the second end portion of the conducting path;
   wherein the first end portion of the conducting path has a larger dopant concentration than the dopant concentration of the second end portion of the conducting path.

2. A conducting path comprising:
   a first end portion having parameters providing a first characteristic impedance at a predetermined frequency;
   a second end portion having parameters providing a second characteristic impedance at the predetermined frequency; and
   a middle portion coupled to the first end portion and to the second end portion, the middle portion providing a transition region between the first characteristic impedance of the first end portion of the conducting path and the second characteristic impedance of the second end portion of the conducting path;
   wherein the first end portion of the conducting path is doped with a different element than a doping element of the second portion of the conducting path.

* * * * *